(12) United States Patent
Yoneda

(10) Patent No.: US 9,508,899 B2
(45) Date of Patent: Nov. 29, 2016

(54) LIGHT EMITTING ELEMENT MANUFACTURING METHOD

(75) Inventor: Akinori Yoneda, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/814,624

(22) PCT Filed: Jul. 6, 2011

(86) PCT No.: PCT/JP2011/065447
§ 371 (c)(1),
(2), (4) Date: Apr. 24, 2013

(87) PCT Pub. No.: WO2012/017771
PCT Pub. Date: Feb. 9, 2012

(65) Prior Publication Data
US 2013/0217163 A1    Aug. 22, 2013

(30) Foreign Application Priority Data
Aug. 6, 2010  (JP) ................ 2010-178184

(51) Int. Cl.
*H01L 33/32* (2010.01)
*H01L 33/00* (2010.01)
*H01L 33/16* (2010.01)

(52) U.S. Cl.
CPC ........... *H01L 33/32* (2013.01); *H01L 33/0095* (2013.01); *H01L 33/007* (2013.01); *H01L 33/16* (2013.01)

(58) Field of Classification Search
CPC ........... H01L 23/00; H01L 2223/5446; H01L 2223/54453; H01L 33/32; H01L 33/007; H01L 33/0095; H01L 33/16
USPC .............. 438/33, 34, 68, 113, 458, 460, 462
See application file for complete search history.

(56) References Cited

U.S. PATENT DOCUMENTS

| 7,572,657 B2* | 8/2009 | Yakushiji .................. 438/33 |
| 8,236,591 B2 | 8/2012 | Ichihara et al. |
| 2002/0115232 A1 | 8/2002 | Kanae |
| 2007/0205490 A1* | 9/2007 | Kusunoki .................. 257/620 |

(Continued)

FOREIGN PATENT DOCUMENTS

| CN | 101772846 A | 7/2010 |
| JP | 11-233458 | 8/1999 |

(Continued)

OTHER PUBLICATIONS

Tanaka (JP11233458) English translation.*

(Continued)

*Primary Examiner* — Latanya N Crawford
(74) *Attorney, Agent, or Firm* — Squire Patton Boggs (US) LLP

(57) ABSTRACT

A light emitting element manufacturing method includes a wafer preparing process of preparing the semiconductor wafer, and a wafer dividing process of dividing the semiconductor wafer. In the wafer dividing process, in a vertical dividing region, a line position shifted by a predetermined distance from a center line of the vertical dividing region in a width direction to one side in the width direction is taken as the cutting start point to divide the semiconductor wafer.

18 Claims, 6 Drawing Sheets

(56) References Cited

U.S. PATENT DOCUMENTS

| | | | |
|---|---|---|---|
| 2008/0070380 A1* | 3/2008 | Kusunoki | 438/462 |
| 2008/0290365 A1* | 11/2008 | Sakamoto et al. | 257/103 |
| 2009/0101925 A1* | 4/2009 | Shakuda | 257/94 |
| 2010/0187542 A1* | 7/2010 | Ichihara et al. | 257/76 |
| 2011/0275172 A1* | 11/2011 | Okabe | 438/33 |

FOREIGN PATENT DOCUMENTS

| | | | | |
|---|---|---|---|---|
| JP | 11-233458 A | 8/1999 | | |
| JP | 11233458 A | * 8/1999 | | H01L 21/301 |
| JP | 2000124158 A | 4/2000 | | |
| JP | 2001168388 A | 6/2001 | | |
| JP | 2002246334 A | 8/2002 | | |
| JP | 2005191551 A | 7/2005 | | |
| WO | WO 2009/020033 | 12/2009 | | |

OTHER PUBLICATIONS

International Search Report and Written Opinion dated Aug. 2, 2011 corresponding to International Patent Application No. PCT/JP2011/065447.

* cited by examiner

- SEMICONDUCTOR WAFER 100
- 1 SAPPHIRE SUBSTRATE
- 2 LIGHT EMITTING ELEMENT SEGMENT
- 4b HORIZONTAL DIVIDING REGION
- 3 ORIENTATION FLAT (A-PLANE)
- 4a VERTICAL DIVIDING REGION

- 5 LIGHT EMITTING ELEMENT

LIGHT EMITTING ELEMENT MANUFACTURING METHOD

TECHNICAL FIELD

The present invention relates to a light emitting element manufacturing method that obtains light emitting elements by dividing a semiconductor wafer.

BACKGROUND ART

In a semiconductor process, multiple semiconductor element segments (light emitting element segments) arranged and disposed on a semiconductor wafer are formed simultaneously through photolithography, vacuum deposition, etc. A dividing region for dividing the light emitting element segments is formed between the simultaneously formed light emitting element segments, and a dividing line along the center of this dividing region is cut vertically and horizontally by dicing, etc., thereby dividing the light emitting element segments into individual rectangular semiconductor chips (light emitting elements).

The area of the light emitting elements has been downsized for the cost reduction of the light emitting element, but the smaller the size of the light emitting element becomes, the larger the area of the dividing region in the semiconductor wafer becomes. Hence, in order to increase the number of the light emitting elements obtainable from the semiconductor wafer, there is a technical problem to effectively narrow down the dividing region.

For example, Patent Literature 1 discloses a technology which forms the semiconductor wafer in such a way that the width of a vertical dividing region and that of a horizontal dividing region differ from each other, and which narrows down the width of the dividing region in a direction along the longer side of a semiconductor element (while the width of the shorter side is extended). Moreover, Patent Literature 2 discloses a semiconductor wafer that elongates the width of a dicing line which includes an alignment mark for a stepper. Furthermore, Patent Literature 3 discloses a technology of disposing the shorter side of the semiconductor element segment in the horizontal direction to an orientation flat where chipping of the semiconductor wafer is not likely to occur, thereby narrowing down the width of the dividing region along this shorter side.

PRIOR ART DOCUMENTS

Patent Literatures

Patent Literature 1: JP H11-233458 A
Patent Literature 2: JP 2000-124158 A
Patent Literature 3: JP 2002-246334 A

DISCLOSURE OF INVENTION

Problems to be Solved by the Invention

The prior arts have, however, following disadvantages.
When a GaN-based semiconductor is laminated on a sapphire substrate having a C-plane as a principal surface and the semiconductor wafer is divided, a cutting start point that is a target cutting position is misaligned from a cut position that is a position to be cut because of the crystalline property of the sapphire. That is, when the semiconductor wafer is divided, the sapphire substrate breaks up in an oblique direction to the thickness direction of the semiconductor wafer when viewed in the cross section of the semiconductor wafer from the cutting start point of the dividing region in a predetermined crystal orientation. This misalignment affects the characteristics of the light emitting element and the number of the obtainable light emitting elements.

According to the above-explained prior arts, however, the width of a predetermined dividing region is narrowed down in order to increase the number of the obtainable light emitting elements and to suppress a reduction of the mechanical strength of the light emitting element, and the above-explained misalignment is not taken into consideration. Hence, there is a disadvantage that the appearance of the light emitting element becomes poor since the cut position becomes too close to the light emitting element due to the misalignment when the semiconductor wafer is divided. Moreover, the active layer of the light emitting element unit is damaged because of the misalignment, resulting in a reduction of an output by the light emitting element and a leakage thereof.

The semiconductor wafer is divided while offsetting the cutting start point and the cut position in consideration of the misalignment, but a relationship between the cutting start point of the dividing region and the position of an N-electrode in the light emitting element segment where no active layer is present is not taken into consideration.

The present invention has been made in view of the above-explained disadvantages, and it is an object of the present invention to provide a light emitting element manufacturing method that is capable of reducing a negative effect to a light emitting element originating from cutting when a semiconductor wafer is divided.

Means for Solving the Problems

In order to address the above-explained disadvantages, a light emitting element manufacturing method of the present invention is a method of dividing a semiconductor wafer which has a plurality of rectangular light emitting element segments arranged and disposed in vertical and horizontal directions by laminating a GaN-based semiconductor on a sapphire substrate having a C-plane as a principal surface, has a horizontal dividing region to be divided along a direction parallel to an A-plane of the sapphire substrate with a narrower width than a vertical dividing region to be divided along a direction perpendicular to the A-plane, and has an N-electrode of the light emitting element segment disposed on at least one side of both sides of the vertical dividing region to obtain light emitting elements with a cutting start point being provided at a −C-plane side of the sapphire substrate, the method including: a wafer preparing process of preparing the semiconductor wafer; and a wafer dividing process of dividing the prepared semiconductor wafer, in which in the wafer dividing process, in the vertical dividing region, a line position shifted by a predetermined distance from a center line of the vertical dividing region in a width direction to one side in the width direction is taken as the cutting start point to divide the semiconductor wafer. Note that the −C-plane means the rear face when the C-plane is defined as the front face.

According to this manufacturing method, in the semiconductor wafer prepared through the wafer preparing process, since the horizontal dividing region has a narrower width than that of the vertical dividing region, the number of the obtainable light emitting elements or the area of active layers (P layers) can be increased. Moreover, since it is unnecessary to narrow down the width of the vertical dividing region, the damage of the light emitting element segments can be reduced. Furthermore, since a range where the active layer is present in the vertical-dividing-region side at which chipping is likely to occur decreases by disposing the N-electrode on at least one side of both sides of the vertical dividing region, the damage of the light emitting element segments can be reduced. In the wafer dividing process, the cutting start points of the vertical dividing regions are shifted when the semiconductor wafer is divided, and thus the appearance failure of the light emitting elements and the damage of the light emitting element segments can be reduced.

According to the light emitting element manufacturing method according to the present invention, a plurality of convexities are formed on the sapphire substrate, the convexities are in a polygonal shape having respective top portions in a same shape when viewed from a top and respective crests directed in a same direction in all convexities, when one of the polygonal crests is directed to a left in the horizontal direction in the vertical and horizontal directions, the line position is shifted to a right of the center line, and when one of the polygonal crest is directed to a right, the line position is shifted to a left of the center line.

According to such a manufacturing method, since the line position of the cutting start point can be set at either one of the right or left side of a center line in accordance with the direction of the polygonal crest in the convexity, the setting of the line position of the cutting start point can be facilitated. Note that the center line is the line position of the center in the width direction in the vertical dividing region.

According to the light emitting element manufacturing method according to the present invention, it is preferable that the N-electrode of the light emitting element segment should be disposed on at least a side where the N-electrode becomes closer to the line position between the vertical dividing regions at both sides.

According to such a manufacturing method, since the N-electrode is disposed at a side where the damage of the light emitting element segment is more likely to occur, the damage of the light emitting element segments can be further reduced.

According to the light emitting element manufacturing method according to the present invention, the light emitting element segment is oblong, and a shorter side of the rectangle is formed so as to be parallel to the vertical dividing region.

According to such a manufacturing method, since the shorter sides of the rectangles of the light emitting element segments are placed at the vertical-dividing-region sides where chipping is likely to occur, the damage of the active layers of the light emitting element segments originating from cutting of the vertical dividing regions can be reduced. Moreover, the number of the obtainable light emitting elements or the area of the active layers can be increased by narrowing down the widths of the horizontal dividing regions in comparison with a case in which the rectangles are formed so as to have the longer sides in parallel with the vertical dividing regions.

Regarding the light emitting element manufacturing method of the present invention, the light emitting element segments may be square. In those light emitting elements in a square shape when viewed from the top, a negative effect to the light emitting elements can be reduced, and the number of the obtainable light emitting elements or the area of the active layers can be increased.

Effect of the Invention

According to the light emitting element manufacturing method of the present invention, an occurrence of an appearance failure of the light emitting element can be reduced. Moreover, since damages of the light emitting segment can be reduced, an output reduction of the light emitting element and an occurrence of a leakage can be reduced. Accordingly, a negative effect to the light emitting element can be reduced, and the occurrence rate of defective light emitting elements can be reduced. Furthermore, by narrowing down the width of the horizontal dividing region, the number of the obtainable light emitting elements can be increased and the active layer can be increased.

BEST MODE FOR CARRYING OUT THE INVENTION

Figure 1A:
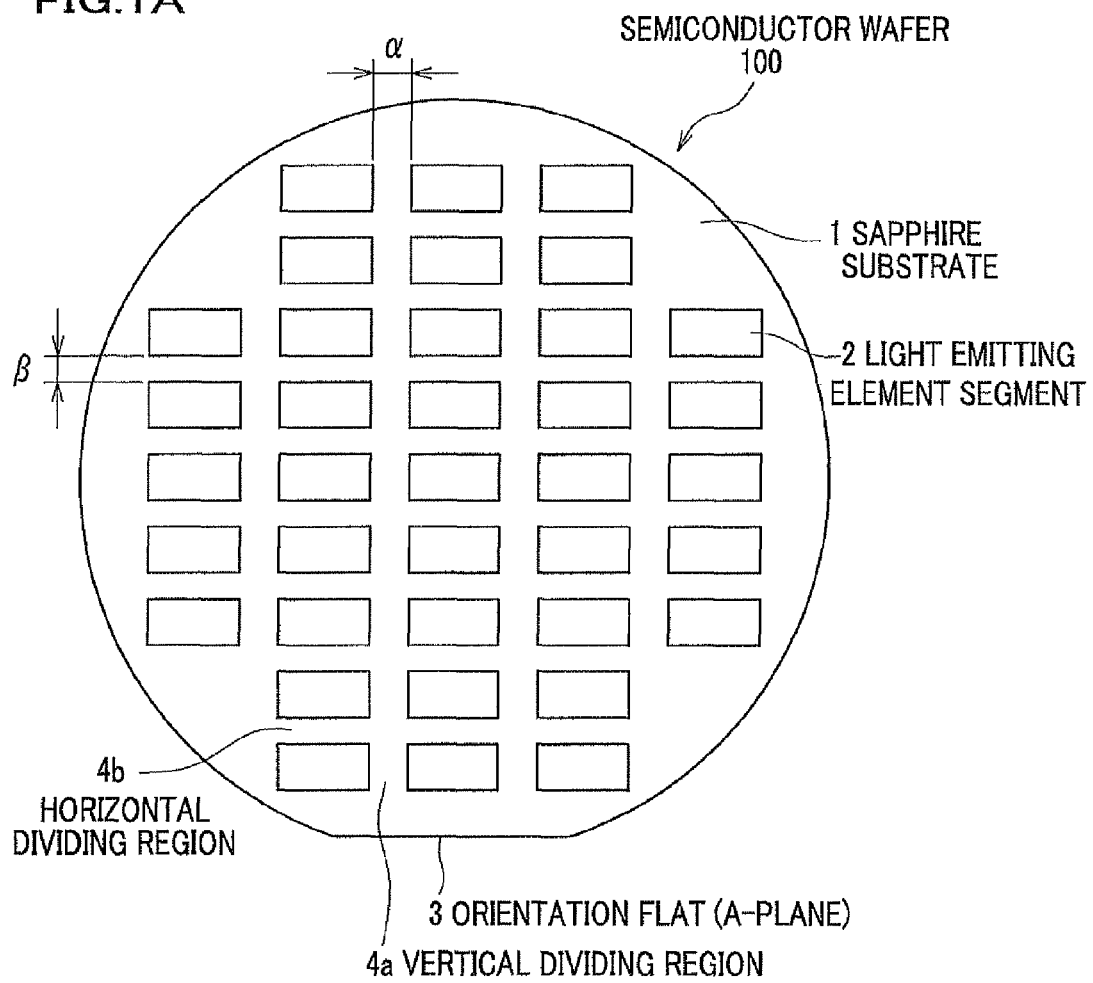
FIG. 1A is a plan view illustrating a structure of a semiconductor wafer applied to an embodiment of the present invention.

A light emitting element manufacturing method according to an embodiment of the present invention will now be explained below with reference to the drawings. Note that sizes and positional relationship, etc., of structural elements illustrated in respective figures are exaggerated in some cases in order to clarify the explanation. Moreover, in the following explanation, basically, the same name and reference numeral indicate the same or equivalent structural element, and the detail explanation thereof is omitted accordingly.

In principle, it is presumed that an orientation flat (hereinafter, referred to as an orientation flat) (an A-plane) in each figure is defined as the bottom or the front in the plane of paper (in FIG. 2A, however, the portion indicated with a deep color is the A-plane). Moreover, when a direction is explained in the present embodiment, with the oriental flat being the bottom side or the front side of the plane of paper, the left side relative to the plane of paper is defined as "left" and the right side relative to the plane of paper is defined as "right".

<<Light Emitting Element Manufacturing Method>>

Figure 1B:
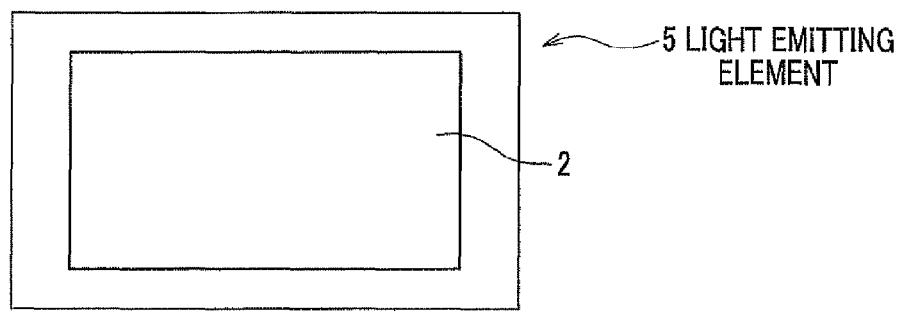
FIG. 1B is a plan view of a light emitting element.

As illustrated in FIGS. 1A and 1B, a manufacturing method of a light emitting element 5 is a method of manufacturing the light emitting elements (semiconductor chips) 5 by dividing a semiconductor wafer 100 having a plurality of rectangular light emitting element segments 2 arranged and disposed in the vertical and horizontal directions and formed by laminating a GaN-based semiconductor on a sapphire substrate 1 having a C-plane as a principal surface, with cutting start points 12a and 12b (see FIG. 3) being provided at the −C-plane side of the sapphire substrate 1. This method includes a wafer preparing process and a wafer dividing process. Regarding the vertical and horizontal directions, when viewed within the C-plane of the sapphire substrate 1, a direction perpendicular to the A-plane of the sapphire substrate 1 is the vertical direction, and a direction parallel to the A-plane is the horizontal direction. Moreover, when an explanation will be given of an example case in which the sapphire substrate 1 has the A-plane as an orientation flat 3, it facilitates understanding, and thus, the explanation will be also given with reference to the orientation flat 3.

Each process will be explained below.

<Wafer Preparing Process>

A wafer preparing process is a process for preparing the semiconductor wafer 100.

First, a structure of the semiconductor wafer 100 will be explained.

[Semiconductor Wafer]

As illustrated in FIG. 1A, the semiconductor 100 includes, on the sapphire substrate 1, the plurality of light emitting element segments 2 which are in a rectangular shape when viewed from the top, and which are arranged and disposed in the vertical and horizontal directions, horizontal dividing regions 4b that are to be divided along a direction parallel to an A-plane 3 of the sapphire substrate 1, and vertical dividing regions 4a that are to be divided along a direction perpendicular to the A-plane 3 (hereinafter, the vertical dividing region 4a and the horizontal dividing region 4b are also referred to as dividing regions 4a and 4b accordingly).

(Sapphire Substrate)

Figure 2A:
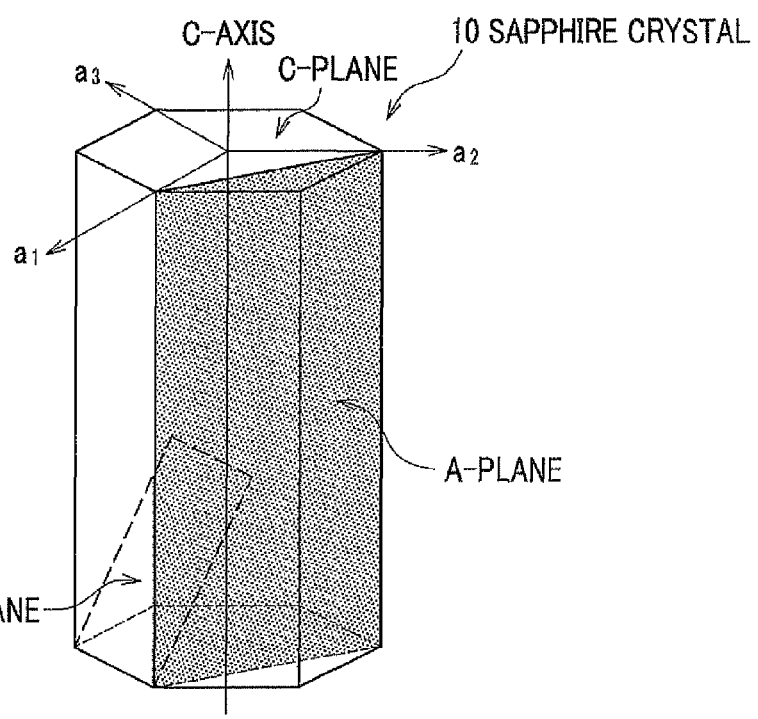
FIG. 2A is a perspective view illustrating a structure of a sapphire crystal.
Figure 2B:
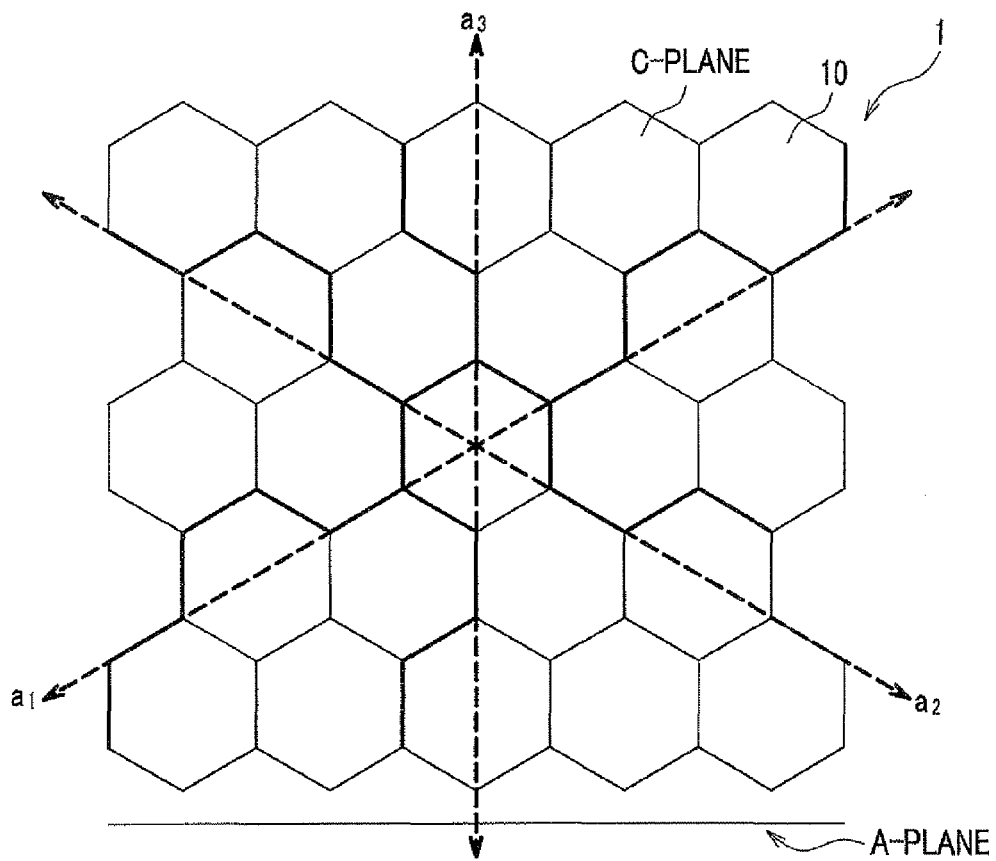
FIG. 2B is a plan view illustrating an aggregate of sapphire crystals.

As illustrated in FIGS. 2A and 2B, the sapphire substrate 1 is formed of an aggregate of sapphire crystals 10 having a predetermined sapphire crystal structure, and has the C-plane as the principal surface. The sapphire substrate 1 has a direction in which the sapphire substrate easily breaks up (a parting direction) because of the crystalline property of the sapphire. The arrows in FIG. 2B indicate the directions in which the sapphire substrate 1 easily breaks up, and for example, the sapphire substrate is likely to break up along the thick lines in FIG. 2B.

A direction perpendicular to the A-plane (11-20) 3 is the direction in which the sapphire substrate easily breaks up, and the vertical dividing regions 4a are formed along this direction, i.e., a crystalline orientation <11-20>. Conversely, a direction parallel to the A-plane (11-20) 3 (perpendicular to an M-plane (1-100)) is the direction in which the sapphire substrate is not likely to break up, and the horizontal dividing regions 4b are formed along this direction, i.e., a crystalline orientation <1-100>. When the semiconductor wafer 100 is divided, chipping is more likely to occur in the direction of the crystalline orientation <11-20> than the direction of the crystalline orientation <1-100>.

The orientation flat (orientation flat) 3 cut linearly and parallel to the direction of the crystalline orientation <1-100> is provided. In general, since this orientation flat 3 is provided in such a way that the A-plane 3 as an orientation flat plane becomes parallel to the direction of the crystalline orientation <1-100>, the vertical dividing regions 4a and the horizontal dividing regions 4b are set with this oriental flat 3 being as a guideline.

It is preferable that a plurality of convexities 40 (see FIG. 5A and FIG. 6A) should be formed on the sapphire substrate 1.

When the sapphire substrate 1 having the C-plane as a principal surface and the A-plane 3 as an oriental flat plane is applied for the semiconductor wafer 100, the convexities 40 in a predetermined shape can be formed on the C-plane in accordance with the shape of a mask pattern and an etching condition (e.g., the kind of an etchant and an etching time).

In the case of a semiconductor light emitting element having the flat sapphire substrate 1, light propagated in a crosswise direction in a semiconductor layer is partially absorbed by the semiconductor layer and an electrode during the propagation and attenuates until it goes out from the semiconductor layer. When, however, the convexities 40 are provided, because of the light scattering and diffraction effects by the convexities 40, luminous flux to the upper or lower space of the sapphire substrate 1 increases, and luminance (front luminance) can be increased when the light emitting plane of the light emitting element is observed from the front side. Moreover, because of the light scattering and diffraction effects by the convexities 40, light propagated in the crosswise direction in the semiconductor layer can be reduced, and the absorption loss during the propagation can be reduced, thereby increasing the total amount of emitted light. In addition, even if the convexities 40 are formed on the surface part of the sapphire substrate 1, a crystal defect originating from the convexities 40 hardly grows on the semiconductor layer, and thus the above-explained high external quantum efficiency can be stably ensured.

Figure 5A:
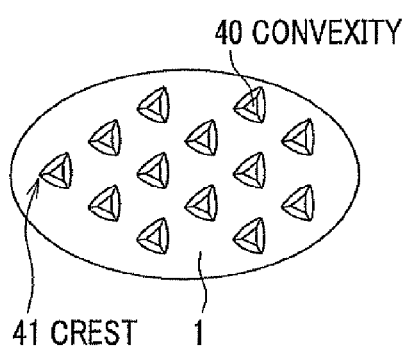
FIG. 5A is a plan view illustrating a shape of a convexity and a direction of a crest.
Figure 6A:
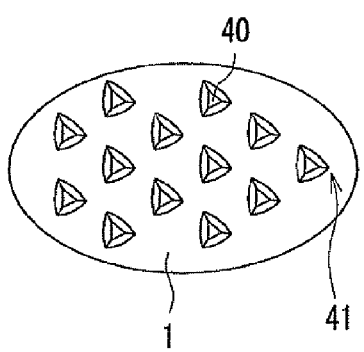
FIG. 6A is a plan view illustrating a shape of a convexity and a direction of a crest.

All convexities 40 are in a polygonal shape having a top portion in the same shape when viewed from the top, and having a crest (an acute angle) 41 directed in the same direction (see FIG. 5A and FIG. 6A). An example polygonal shape is a triangle, a parallelogram, or a hexagon, and is preferably, a regular triangle, a diamond shape, or a regular hexagon. Formation of the convexities 40 in a polygonal shape means to let the planar shape of the convexities to be in a polygonal shape when observed from the top of the substrate. That is, when viewed from the C-plane, it is fine if the top portion of the convexity 40 is in a polygonal shape, and the bottom shape of the convexity 40 may be in a circular shape or a polygonal shape. Moreover, it is preferable that the cross-sectional shape of the convexity should be trapezoidal. This cross-sectional shape enhances the light scattering and diffraction efficiencies. It is unnecessary that the planar shape of the convexity 40 and the cross-sectional shape thereof are a geometrically complete polygonal or trapezoidal shape, and may have a rounded corner because of the matter of processing.

One of the directions of the crests 41 of this polygon tends to match a parallel direction to the orientation flat plane, and the crest 41 tends to be directed to either right or left. As will be discussed later, corresponding to this direction, the line position of the cutting start point 12a can be set at either one of the right or left side of a center line 11. It is preferable that the size of the convexity 40 and the space between respective convexities should be equal to or smaller than 10 μm in actual manufacturing. It is more preferable that those should be equal to or smaller than 5 μm, since a scattering plane can be increased.

The method of forming the convexities 40 on the sapphire substrate 1 is not limited to any particular one, and convexities can be formed by a conventionally well-known method in the art. An example method is to perform etching, such as dry etching or wet etching as will be discussed later, using a mask pattern in an appropriate shape. In particular, the wet etching is preferable. In this case, an example etchant is a mixed acid of sulfuric acid and phosphoric acid, KOH, NaOH, phosphoric acid, or potassium pyrosulfate.

The shape of the convexities 40 can be controlled by adjusting, for example, the shape of the applied mask pattern, an etching method, and an etching condition. In this case, the mask pattern can be formed of a material like an insulating film (e.g., a resist or $SiO_2$), and an example shape of the mask pattern is a repetitive pattern, etc., of circles, ellipses, or polygonal shapes, such as triangles or squares. The formation of such a mask pattern can be enabled by the conventionally well-known method, such as the photolithography and the etching process.

For the etching method for forming the mask pattern the conventionally well-known method in the art, such as the dry etching or the wet etching, can be applied. An example dry etching is a reactive ion etching, a reactive ion beam etching, ion milling, a focused-ion-beam etching, or an ECR etching. An example etchant for the wet etching is the same as the ones explained above.

(Light Emitting Element Segment)

As illustrated in FIG. 1A, the plurality of light emitting element segments 2 are arranged and disposed in the vertical and horizontal directions on the sapphire substrate 1 having a GaN-based semiconductor laminated thereon. The light emitting element segments 2 have a rectangular shape when viewed from the top, are rectangles in this example, and are formed in such a way that the shorter sides of those respective rectangles are in parallel with the vertical dividing regions 4a. According to such a structure, since the shorter sides of the rectangles of the light emitting element segments 2 are placed at the vertical-dividing-region-4a sides, damages of the light emitting layers, i.e., the active layers (P layers) 30 (see FIG. 3) of the light emitting element segments 2 originating from cutting of the vertical dividing regions 4a can be reduced, and the negative effect of the cutting (a cutting effect) can be reduced. Moreover, when it is attempted to enlarge the light emitting element segments 2, the area of the active layers 30 can be increased by narrowing down the widths of the horizontal dividing regions 4b in comparison with the case in which the rectangles are formed so as to have the longer sides in parallel with the vertical dividing regions 4a. Moreover, when the light emitting element segments 2 are disposed in a manner stemmed in the vertical direction, the number of the obtainable light emitting elements 5 can be increased. However, the shorter sides of the rectangles may be formed in parallel with the vertical dividing regions 4a depending on the size of the semiconductor wafer 100 and the size and number of the light emitting element segments 2, etc., and as will be discussed later, respective shapes of the light emitting element segments 2 may be a square when viewed from the top.

An N-electrode 20 (see FIG. 3) of the light emitting element segment 2 is disposed on at least one side of the vertical-dividing-region-4a sides. Since the vertical dividing regions 4a is likely to cause chipping when the wafer is divided, the active layer 30 at both sides of the light emitting element segment 2 adjacent to the vertical dividing regions 4a is likely to be damaged. However, since no active layer 30 is present in the region where the N-electrode 20 is present, a range where the active layer 30 is present in the vertical-dividing-region-4a side decreases by disposing the N-electrode 20 at the vertical-dividing-region-4a side, and the damage of the active layer 30 can be reduced.

Figure 3:
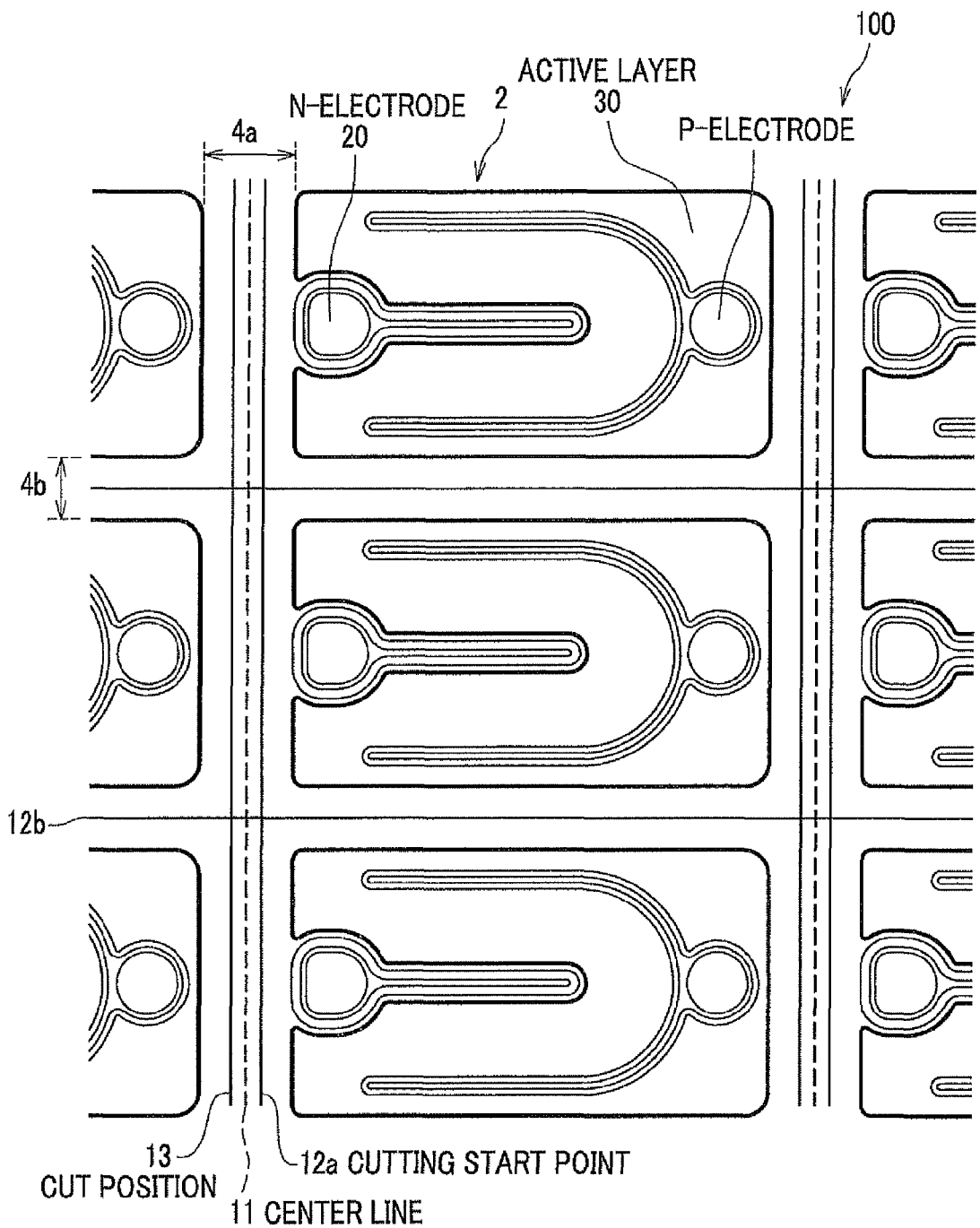
FIG. 3 is a plan view illustrating structures of a light emitting element segment and a dividing region.

As illustrated in FIG. 3, it is preferable that the N-electrode 20 should be disposed at least at, between the vertical dividing regions 4a at both sides, a side closer to the line position of the cutting start point 12a which is shifted by a predetermined distance from the center line 11 of the vertical dividing region 4a in the width direction to one side in the width direction. In the vertical dividing region 4a, the active layer 30 of the light emitting element segment 2 at the side having the cutting start point 12a shifted is more likely to be affected by the cutting effect since the distance from the cutting start point 12a becomes short. Since no active layer 30 is present in the region where the N-electrode 20 is present, by disposing the N-electrode 20 at, between the vertical dividing regions 4a at both sides, the side closer to the line position of the cutting start point 12a shifted by a predetermined distance from the center line 11 of the vertical dividing region 4a in the width direction, the damage of the active layer 30 can be further reduced, and the range on which the cutting effect acts can be decreased. Note that the N-electrode 20 may be disposed only at the side closer to the line position, or may be disposed at the both sides of the vertical dividing regions 4a.

(Dividing Region)

As illustrated in FIG. 1A, the dividing regions 4a and 4b are regions for dividing the light emitting element segments 2 from the semiconductor wafer 100, and include the horizontal dividing regions 4b which are divided in a direction parallel to the A-plane 3 of the sapphire substrate 1, and the vertical dividing regions 4a which are divided in a direction perpendicular to the A-plane 3 of the sapphire substrate 1. In those dividing regions 4a and 4b, a width β of the horizontal dividing regions 4b is formed narrower than a width α of the vertical dividing regions 4a. As explained above, the widths β of the horizontal dividing regions 4b where chipping is not likely to occur are narrowed down, thereby increasing the number of the obtainable light emitting elements 5 or the area of the active layers 30. Moreover, since the widths α of the vertical dividing regions 4a are not narrowed down, the damage of the light emitting element segments 2 can be reduced. The widths α and β of the dividing regions 4a and 4b vary depending on the size, etc., of the semiconductor wafer 100 and those of the light emitting element segments 2, but for example, the width of the vertical dividing region 4a is from 15 to 70 μm, and the width of the horizontal dividing region 4b is from 10 to 60 μm.

The widths of the dividing regions 4a and 4b and the layout, etc., of the light emitting element segments 2, and the area of the active layer 30 and a cutting effecting range will now be explained with reference to FIGS. 4A to 4D and table 1.

In this example, by drawing the light emitting element segments 2 in a shape illustrated in FIGS. 4A to 4D on the cells which are multiple mesh squares and measuring the number of cells in a spreadsheet software, the widths of the dividing regions 4a and 4b and the layout, etc., of the light emitting elements 2, and the area of the active layer 30 and the cutting effecting range are examined.

Figure 4A:
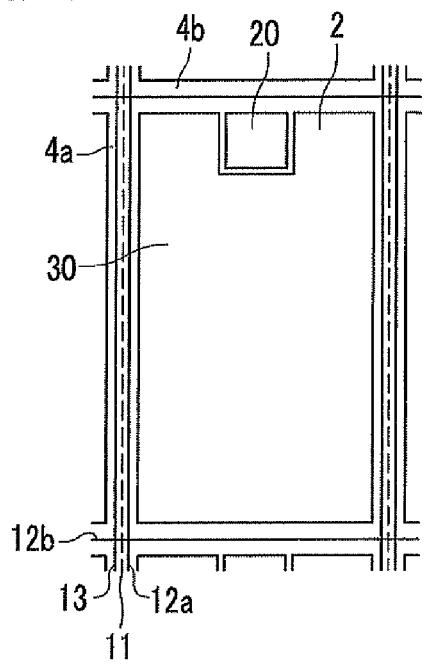
FIGS. 4A to 4D are plan views for explaining a width of a dividing region, a layout, etc., of light emitting element segments, an area of an active layer, and a range where cutting affects.
Figure 4B:
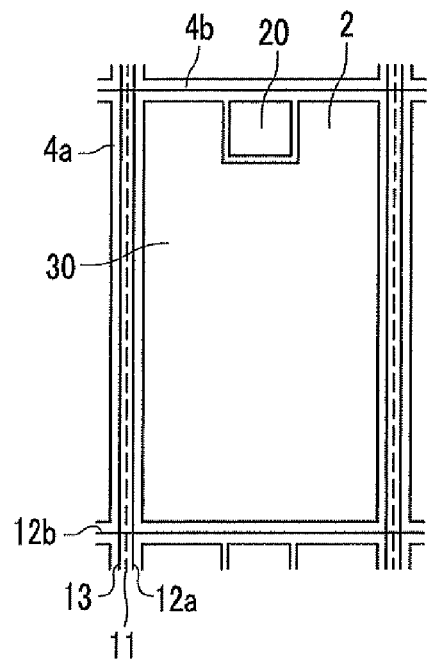
Figure 4C:
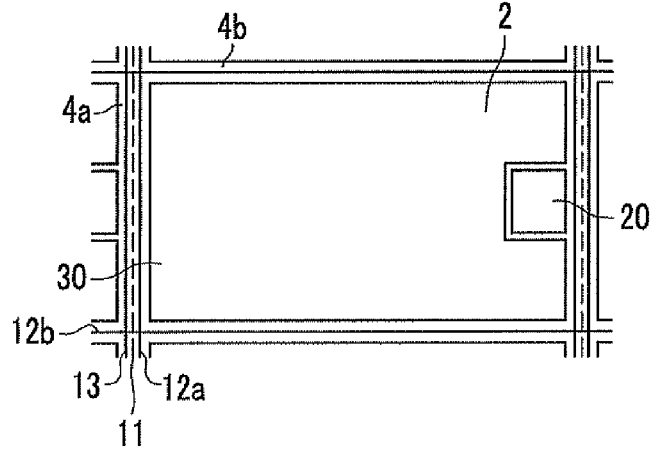
Figure 4D:
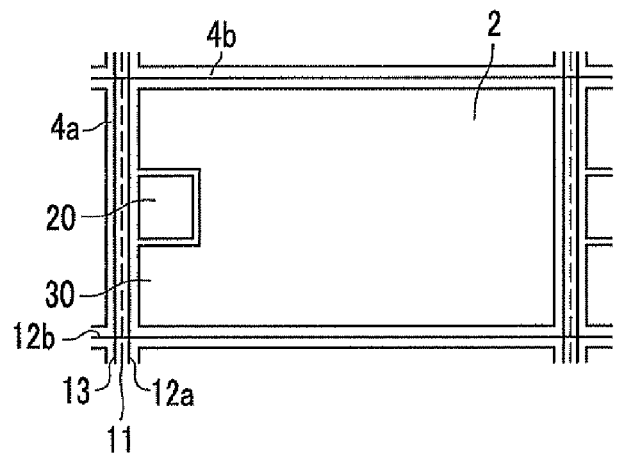

In FIG. 4A, the width of the vertical dividing region 4a is the same as that of the horizontal dividing region 4b, and the light emitting element segment 2 is placed vertically (the longer side is in parallel with the vertical dividing region 4a). In FIG. 4B, the width of the horizontal dividing region 4b is narrowed down, and the light emitting element segment 2 is placed vertically (the longer side is in parallel with the vertical dividing region 4a). In FIG. 4C, the width of the horizontal dividing region 4b is narrowed down, the light emitting element segment 2 is placed horizontally (the longer side is in parallel with the horizontal dividing region 4b), and the N-electrode 20 is disposed only at the opposite side of the side where the N-electrode 20 becomes closer to the line position of the cutting start point 12a between the vertical dividing regions 4a at both sides. In FIG. 4D, the width of the horizontal dividing region 4b is narrowed down, the light emitting element segment 2 is placed horizontally (the longer side is in parallel with the horizontal dividing region 4b), and the N-electrode 20 is disposed only at the side where the N-electrode 20 becomes closer to the line position of the cutting start point 12a between the vertical dividing regions 4a at both sides. Note that, in FIGS. 4A to 4D, it is presumed that the cutting start points 12a are on the rear face of the semiconductor wafer 100, and cut positions 13 are on the front face (C-plane) of the semiconductor wafer. Moreover, regarding the cutting effecting range, since the side where the vertical side of the light emitting element segment 2 becomes closer to the cutting start point 12a is more likely to be affected by the cutting effect, this side is examined.

TABLE 1

| Shapes in FIGS. 4A to 4B | Area of Active Layer | | Distance from Cutting Start Point to Active Layer | | Cutting Effecting Range | |
|---|---|---|---|---|---|---|
| | Number of Cells | Ratio | Number of Cells | Ratio | Number of Cells | Ratio |
| A | 3102 | 1.00 | 2 | 1.00 | 74 | 1.00 |
| B | 3190 | 1.03 | 2 | 1.00 | 76 | 1.03 |
| C | 3250 | 1.05 | 2 | 1.00 | 46 | 0.62 |
| D | 3250 | 1.05 | 2 | 1.00 | 32 | 0.43 |

As shown in table 1, when the width of the horizontal dividing region 4b is narrowed down like the cases of FIGS. 4B to 4D in comparison with FIG. 4A, the area of the active layer 30 can be increased. Moreover, when the width of the vertical dividing region 4a is consistent like the cases of FIGS. 4A to 4D, the distance from the cutting start point 12a to the active layer 30 is also consistent. In comparison with FIG. 4A, since the area of the active layer 30 increases in the case of FIG. 4B, the cutting effecting range becomes slightly large, but when the vertical-dividing-region-4a side is the shorter side like the case of FIG. 4C, the cutting effecting range can be reduced. Furthermore, when the N-electrode 20 is disposed only at the side closer to the line position of the cutting start point 12a like the case of FIG. 4D, the cutting effecting range can be further decreased by what corresponds to the presence of the N-electrode 20.

[Semiconductor Wafer Manufacturing Method]

The manufacturing of the semiconductor wafer 100 is carried out by, in accordance with a conventionally well-known technique, for example, laminating a GaN-based semiconductor on the one face (C-plane) of the sapphire substrate 1 to which the orientation flat 3 is provided through photolithography, vacuum deposition, etc., and by arranging and disposing the plurality of rectangular light emitting element segments 2 in the vertical and horizontal direction. Next, the dividing regions 4a and 4b for dividing the light emitting element segments 2 are formed between the light emitting element segments 2 formed simultaneously, but in order to cause the widths β of the horizontal dividing regions to be narrower than the widths α of the vertical dividing regions 4a, the widths of the dividing regions 4a and 4b are adjusted accordingly.

<Wafer Dividing Process>

The wafer dividing process is a process for dividing the prepared semiconductor wafer 100 explained above.

The semiconductor wafer 100 can be divided by a conventionally well-known method, such as a dicing technique for cutting along the cutting start points 12a of the vertical dividing regions 4a and along the cutting start points 12b of the horizontal dividing regions 4b by a blade, or a scribing technique for breaking up along the cutting start points 12a and 12b of the dividing regions 4a and 4b.

For example, first of all, the cutting start points 12a and 12b which are target cutting positions are set on the −C-plane side (rear face side), and laser beam are emitted to form break lines (altered segments) on the line positions of the cutting start points 12a and 12b. Regarding the laser beam, various kinds of lasers, such as laser which generates pulse laser, or CW laser which is capable of causing multi-photon absorption can be adopted. In particular, laser which generates pulse laser, such as femtosecond laser, picosecond laser, or nanosecond laser, is preferable. Moreover, the wavelength of the laser is not limited to any particular one, and for example, various kinds of lasers, such as Nd:YAG laser, Nd:YVO$_4$ laser, Nd:YLF laser, or titanium-sapphire laser can be adopted.

The laser beam is emitted from the −C-plane side of the semiconductor wafer 100 in consideration of the absorption in the semiconductor layer. Note that the term "side" of the −C-plane side in this example means that it is close to the −C-plane at least from the midpoint in the thickness direction. That is, the semiconductor wafer 100 is to be cut from the rear face. The irradiation to the active layers 30 with the laser beam is avoided in this manner, thereby suppressing a reduction of the luminous efficiency at minimum.

When the dicing technique is applied, a preparation for predetermined dicing is arranged, and the dicing is performed along the cutting start points 12a and 12b of the dividing regions 4a and 4b using a dancing blade with a predetermined width, thereby dividing the semiconductor wafer 100. When the scribing technique is applied, cracking is caused along the cutting start points 12a and 12b of the dividing regions 4a and 4b, thereby dividing the semiconductor wafer 100. Hence, a large number of the light emitting elements 5 can be obtained from the semiconductor wafer 100.

Figure 5B:
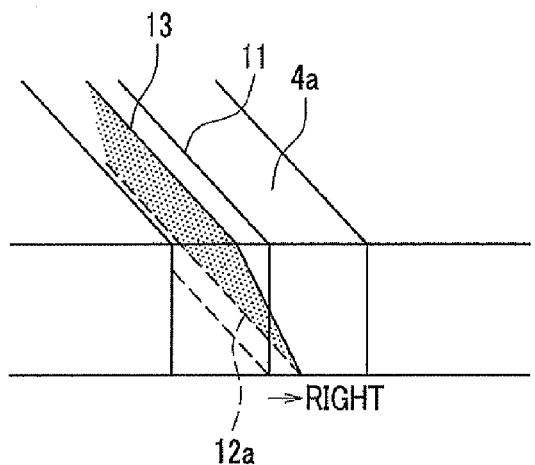
FIG. 5B is a perspective view illustrating how cutting is performed in an oblique direction.
Figure 6B:
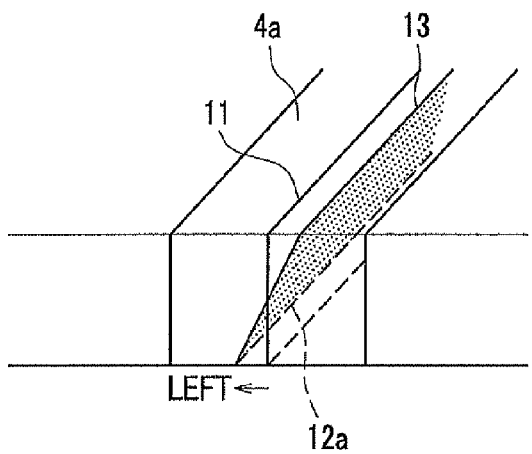
FIG. 6B is a perspective view illustrating how cutting is performed in an oblique direction.

In the vertical dividing region 4a, as explained with respect to the conventional art, when the semiconductor wafer 100 is divided, the sapphire substrate breaks up from the cutting start point 12a of the vertical dividing region 4a in an oblique direction to the thickness direction of the semiconductor wafer 100 when viewed in the cross section of the wafer (see FIGS. 5B and 6B). Hence, according to the present invention, as illustrated in FIG. 3, the wafer is divided while taking the line position which is shifted by a predetermined distance from the center line 11 of the vertical dividing region 4a in the width direction to one side in the width direction as the cutting start point 12a in the vertical dividing region 4a. When the cutting start point 12a and the cut position 13 are offset in this manner, the cut position 13 is prevented from becoming too close to the active layer 30, and thus the damage of the light emitting element segments 2 can be reduced. Moreover, an occurrence of defective products originating from an appearance failure can be suppressed.

Regarding the oblique direction, when it is presumed that the oriental flat plane (A-plane 3) is set as the front face and the cutting start point 12a is set as the bottom in the sapphire substrate 1, and an inclined plane directed to the upper left is defined as "diagonally right" (see FIG. 6B) and an inclined plane directed to the upper right is defined as "diagonally left" (see FIG. 5B), the line position of the cutting start point 12a is shifted to the left of the center line 11 in the case of the diagonal right (see FIG. 6B) and is shifted to the right of the center line 11 in the case of the diagonal left (see FIG. 5B). The shifted distance may be adjusted depending on the size of the semiconductor wafer 100, that of the light emitting element segments 2, and the number of the light emitting element segments 2, etc., accordingly, but for example, is from 1 to 15 μm.

This oblique direction can be confirmed through a breaking test of the sapphire substrate 1. Moreover, it can be also confirmed through the direction of the crests 41 in a polygonal shape of the convexities 40 formed on the above-explained sapphire substrate 1. The relationship between the direction of the crests 41 in those convexities 40 and the oblique direction in a crack will now be explained with reference to FIGS. 5A and 5B and FIGS. 6A and 6B.

As illustrated in FIG. 5A and FIG. 6A, all convexities 40 are in a triangular shape having the top portion in the same shape when viewed from the top, and having the crest 41 directed in the same direction.

In a case in which, for example, the orientation flat plane is set to the front, when one of the crests 41 is directed to the left as viewed from the top and as illustrated in FIG. 5A, a crack is produced in the diagonal left direction as illustrated in FIG. 5B, and when one of the crests 41 is directed to the right as viewed from the top and as illustrated in FIG. 6A, a crack is produced in the diagonal right direction as illustrated in FIG. 6B. When such a relationship between the direction of the crest 41 and the oblique direction in cracking is confirmed in advance, the line positions of the cutting start points 12a can be set based on the direction of the crest 41, and thus the setting of the line positions can be facilitated. Moreover, when the N-electrode 20 is disposed only at the side where the N-electrode 20 becomes closer to the line position between the vertical dividing regions 4a at both sides of the light emitting element segment 2, the layout of the N-electrodes 20 can be set based on the direction of the crest 41. Note that the relationship between the direction of the crest 41 in the convexity 40 and the oblique direction in cracking can be confirmed from a substrate manufacturer in advance.

As illustrated in FIGS. 5A and 5B, when one of the crests 41 in a polygonal shape is directed in the horizontal direction in the vertical and horizontal directions, i.e., to the left with the orientation flat plane being disposed at the front side, a crack is produced in the diagonal left direction, so that the line position of the cutting start point 12a is shifted to the right of the center line 11, and as illustrated in FIGS. 6A and 6B, when one of the crests is directed to the right, a crack is produced in the diagonal right direction, so that the line position of the cutting start point 12a is shifted to the left of the center line 11. The line position of the cutting start point 12a is set at either one of the right or left side of the above-explained center line 11 in accordance with the direction of the polygonal crest 41 in this manner.

The explanation was given of the embodiment of the present invention so far, but the present invention is not limited to the above-explained embodiment, and can be changed within a range that does not depart from the scope and spirit of the present invention.

As another embodiment, for example, the present invention is applicable to semiconductor wafers having light emitting element segments in a square shape.

Another Embodiment

A manufacturing method of a light emitting element is a method of manufacturing the light emitting elements by dividing a semiconductor wafer having a plurality of square light emitting element segments arranged and disposed in the vertical and horizontal directions and formed by laminating a GaN-based semiconductor on a sapphire substrate having a C-plane as a principal surface, with cutting start points being provided at the −C-plane side of the sapphire substrate. This method includes a wafer preparing process and a wafer dividing process.

Figure 7:
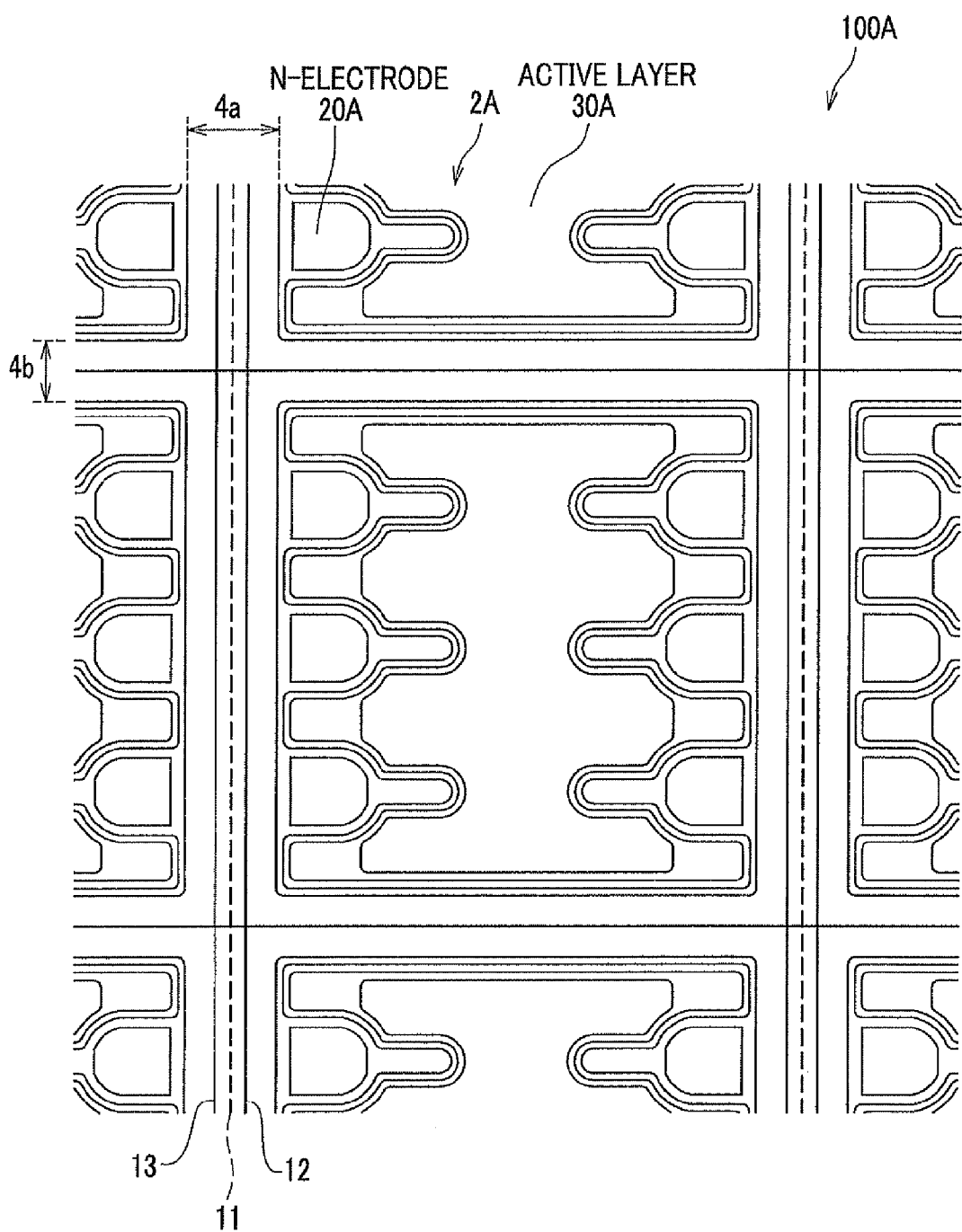
FIG. 7 is a plan view illustrating structures of a light emitting element segment and a dividing region in a semiconductor wafer applied to another embodiment of the present invention.

As illustrated in FIG. 7, a semiconductor wafer 100A includes, on a sapphire substrate, a plurality of light emitting element segments 2A which are in a square shape when viewed from the top, and which are arranged and disposed in the vertical and horizontal directions, the horizontal dividing regions 4b that are to be divided along a direction parallel to the A-plane of the sapphire substrate, and the vertical dividing regions 4a that are to be divided along a direction perpendicular to the A-plane.

In this example, three N-electrodes 20A of the light emitting element segment 2A are provided at each vertical-dividing-region-4a side. However, it is fine if the N-electrodes 20A of the light emitting element segment 2A are disposed on at least one side of the vertical-dividing-region 4a sides, and it is preferable that the N-electrodes should be disposed at, between the vertical dividing regions 4a at both sides, only a side closer to a line position which is shifted by a predetermined distance from the center line 11 of the vertical dividing region 4a in the width direction to one side in the width direction.

The wafer preparing process and the wafer dividing process are the same as those of the above-explained manufacturing method of the light emitting element <<Others>>

The numbers of the N-electrodes 20 and 20A of the light emitting element segments 2 and 2A are not limited to any particular number, and it may be one, or equal to or more than two.

When the present invention is carried out, a process other than the above-explained processes may be placed between respective above-explained processes or before and after those processes within a range which does not negatively affect respective above-explained processes. For example, the method of the present invention may include a substrate cleaning process for cleaning the sapphire substrate, an undesired object removing process for removing undesired objects like foreign materials, a substrate thickness adjusting process for processing the substrate to have a desired thickness by cutting the sapphire substrate from the rear face of the semiconductor wafer (back grinding), and a finishing process for performing polishing, etc., on the cut planes of the light emitting elements.

DESCRIPTION OF REFERENCE NUMERALS

1 Sapphire substrate
2, 2A Light emitting element segment
3 Orientation flat
4a Vertical dividing region
4b Horizontal dividing region
5 Light emitting element (semiconductor chip)
10 Sapphire crystal
11 Center line
12a, 12b Cutting start point
13 Cut position
20, 20A N-electrode
30, 30A Active layer
40 Convexity
41 Crest 100, 100A Semiconductor wafer
α Width of vertical dividing region
β Width of horizontal dividing region

The invention claimed is:
1. A light emitting element manufacturing method of dividing a semiconductor wafer, the method comprising:
a wafer preparing process of preparing the semiconductor wafer, wherein the semiconductor wafer has a plurality of rectangular light emitting element segments arranged and disposed in vertical and horizontal directions by laminating a GaN-based semiconductor on a sapphire substrate having a C-plane as a principal surface, has a horizontal dividing region to be divided along a direction parallel to an A-plane of the sapphire substrate with a narrower width than a vertical dividing region to be divided along a direction perpendicular to the A-plane, and has an N-electrode of the light emitting element segment disposed on at least a first side of both sides of the vertical dividing region to obtain light emitting elements with a cutting start point being provided at a −C-plane side of the sapphire substrate, wherein the light emitting element segment comprises a shorter side and a longer side, and the shorter side of the light emitting element segment is formed so as to be parallel to the vertical dividing region; and
a wafer dividing process of dividing the prepared semiconductor wafer,
wherein in the wafer dividing process, in the vertical dividing region, a line position shifted by a predetermined distance from a center line of the vertical dividing region in a width direction to one side in the width direction toward the first side is taken as the cutting start point to divide the semiconductor wafer.

2. The light emitting element manufacturing method according to claim 1, wherein
a plurality of convexities are formed on the principal surface of the sapphire substrate,
the convexities are in a polygonal shape having respective top portions in a same shape when viewed from a top and respective crests directed in a same direction in all convexities,
when the first side is to a right of the center line, one of the polygonal crests is directed leftwards in the horizontal direction, and
when the first side is to a left of the center line, one of the polygonal crests is directed rightwards in the horizontal direction.

3. The light emitting element manufacturing method according to claim 1, wherein the light emitting element segment is square.

4. The light emitting element manufacturing method according to claim 1, wherein the wafer dividing process comprises setting cutting start points on the −C-plane side using a laser.

5. The light emitting element manufacturing method according to claim 4, wherein the laser comprises a femtosecond pulse laser.

6. The light emitting element manufacturing method according to claim 4, wherein the setting the cutting start points using the laser comprises irradiating the wafer from a rear face side of the wafer, wherein the plurality of rectangular light emitting element segments are on a front face side of the wafer.

7. The light emitting element manufacturing method according to claim 2, wherein the plurality of convexities comprise trigonal convexities.

8. The light emitting element manufacturing method according to claim 1, wherein for a pair of horizontally adjacent vertical columns of the plurality of rectangular light emitting element segments, N-electrodes are disposed on both sides of the vertical dividing region.

9. A light emitting element manufacturing method of dividing a semiconductor wafer, the method comprising:
a wafer preparing process of preparing a semiconductor wafer, wherein the semiconductor wafer has a plurality of light emitting element segments by laminating a GaN-based semiconductor on a sapphire substrate having a C-plane as a principal surface, wherein the plurality of light emitting element segments are defined by a plurality of horizontal dividing regions to be divided along a direction parallel to an A-plane of the sapphire substrate and a plurality of vertical dividing regions to be divided along a direction perpendicular to the A-plane, wherein each of the plurality of light emitting element segments has an N-electrode disposed adjacent to at least one vertical dividing region to the light emitting element segment; and
a wafer dividing process of dividing the prepared semiconductor wafer with respect to a horizontal dividing region and a vertical dividing region to obtain light emitting elements,
wherein in the wafer dividing process, in the vertical dividing region, a line position shifted by a predetermined distance from a center line of the vertical dividing region in a width direction to one side in the width direction is taken as the cutting start point to divide the semiconductor wafer,
wherein the light emitting element segment comprises a shorter side and a longer side, and
wherein the shorter side of the light emitting element segment is formed so as to be parallel to the vertical dividing region.

10. The light emitting element manufacturing method according to claim 9, wherein there is no active layer between the vertical dividing region and the N-electrode disposed adjacent to the vertical dividing region.

11. The light emitting element manufacturing method according to claim 9, wherein
a plurality of convexities are formed on the principal surface of the sapphire substrate,
the convexities are in a polygonal shape having respective top portions in a same shape when viewed from a top and respective crests directed in a same direction in all convexities,
when the first side is to a right of the center line, one of the polygonal crests is directed leftwards in the horizontal direction, and
when the first side is to a left of the center line, one of the polygonal crests is directed rightwards in the horizontal direction.

12. The light emitting element manufacturing method according to claim 11, wherein the plurality of convexities comprise trigonal convexities.

13. The light emitting element manufacturing method according to claim 9, wherein for a pair of horizontally adjacent vertical columns of the plurality of rectangular light emitting element segments, N-electrodes are disposed on both sides of the vertical dividing region.

14. The light emitting element manufacturing method according to claim 9, wherein the light emitting element segment is square.

15. The light emitting element manufacturing method according to claim 9, wherein the wafer dividing process comprises setting cutting start points on the −C-plane side using a laser.

16. The light emitting element manufacturing method according to claim 15, wherein the laser comprises a femtosecond pulse laser.

17. The light emitting element manufacturing method according to claim 15, wherein the setting the cutting start points using the laser comprises irradiating the wafer from a rear face side of the wafer, wherein the plurality of rectangular light emitting element segments are on a front face side of the wafer.

18. The light emitting element manufacturing method according to claim 9, wherein the width of the horizontal dividing region is narrower than that of the vertical dividing region.

* * * * *